(12) United States Patent
Zou et al.

(10) Patent No.: US 10,103,097 B2
(45) Date of Patent: Oct. 16, 2018

(54) CD CONTROL

(71) Applicant: GLOBALFOUNDRIES Singapore Pte. Ltd., Singapore (SG)

(72) Inventors: Zheng Zou, Singapore (SG); Alex See, Singapore (SG); Huang Liu, Singapore (SG); Hai Cong, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 247 days.

(21) Appl. No.: 14/484,220

(22) Filed: Sep. 11, 2014

(65) Prior Publication Data

US 2014/0374920 A1    Dec. 25, 2014

Related U.S. Application Data

(62) Division of application No. 13/655,408, filed on Oct. 18, 2012, now Pat. No. 8,836,139.

(51) Int. Cl.
| | |
|---|---|
| *H01L 21/302* | (2006.01) |
| *H01L 23/48* | (2006.01) |
| *H01L 21/768* | (2006.01) |
| *H01L 23/522* | (2006.01) |
| *H01L 21/311* | (2006.01) |

(52) U.S. Cl.
CPC .... *H01L 23/5226* (2013.01); *H01L 21/31144* (2013.01); *H01L 21/76816* (2013.01); *H01L 21/31116* (2013.01); *H01L 2924/0002* (2013.01)

(58) Field of Classification Search
CPC ...... H01L 23/522; H01L 21/302; H01L 23/48
See application file for complete search history.

(56) References Cited

U.S. PATENT DOCUMENTS

| | | | |
|---|---|---|---|
| 2004/0140564 A1* | 7/2004 | Lee ................. | H01L 21/76801 257/758 |
| 2005/0236694 A1* | 10/2005 | Wu .................. | H01L 21/02126 257/632 |
| 2006/0024948 A1 | 2/2006 | Oh et al. | |
| 2007/0148984 A1* | 6/2007 | Abatchev et al. ............ 438/725 | |
| 2007/0215960 A1* | 9/2007 | Zhu et al. ...................... 257/414 | |
| 2008/0303068 A1* | 12/2008 | Grill ............... | H01L 21/823807 257/288 |
| 2010/0213543 A1 | 8/2010 | Zhang et al. | |

* cited by examiner

*Primary Examiner* — Fernando L Toledo
*Assistant Examiner* — Lawrence-Linh T Nguyen
(74) *Attorney, Agent, or Firm* — Horizon IP Pte Ltd.

(57) ABSTRACT

A method includes providing a substrate with a patterned second layer over a first layer. The second layer includes a second layer opening having a first CD equal to the CD produced by a lithographic system ($CD_L$). $CD_L$ is larger than a desired CD ($CD_D$). A third layer is formed to fill the opening, leaving a top surface of the second layer exposed. The second layer is removed to produce a mesa formed by the third layer. The CD of the mesa is equal to about the first CD. The mesa is trimmed to produce a mesa with a second CD equal to about $CD_D$. A fourth layer is formed to cover the first layer, leaving a top of the mesa exposed. The substrate is etched to remove the mesa and a portion of the first layer below the mesa to form an opening in the first layer with $CD_D$.

20 Claims, 12 Drawing Sheets

CD CONTROL

CROSS-REFERENCE TO RELATED APPLICATION

This application is a divisional application which claims benefit of copending U.S. patent application Ser. No. 13/655,408, filed Oct. 18, 2012, which is herein incorporated by reference for all purposes.

BACKGROUND OF THE INVENTION

The fabrication of integrated circuits (ICs) involves the formation of features on a substrate that make up circuit components, such as transistors, resistors and capacitors. The various features of circuit components are formed using optical lithography. Optical lithography involves transferring a pattern of a reticle onto a substrate. For example, an exposure source exposes a photoresist layer through the mask, which is developed to replicate the pattern on the mask. The substrate is then etched to create features on the substrate unprotected by the mask, transferring the pattern of the reticle onto the substrate.

Due to lithography processing limitations, however, it is sometimes difficult to create openings with the desired dimension or desired critical dimension ($CD_D$). For example, in the case of forming contact openings in a dielectric layer, the CD of the contact openings may be larger than desired or required by design requirements.

Figure 3:
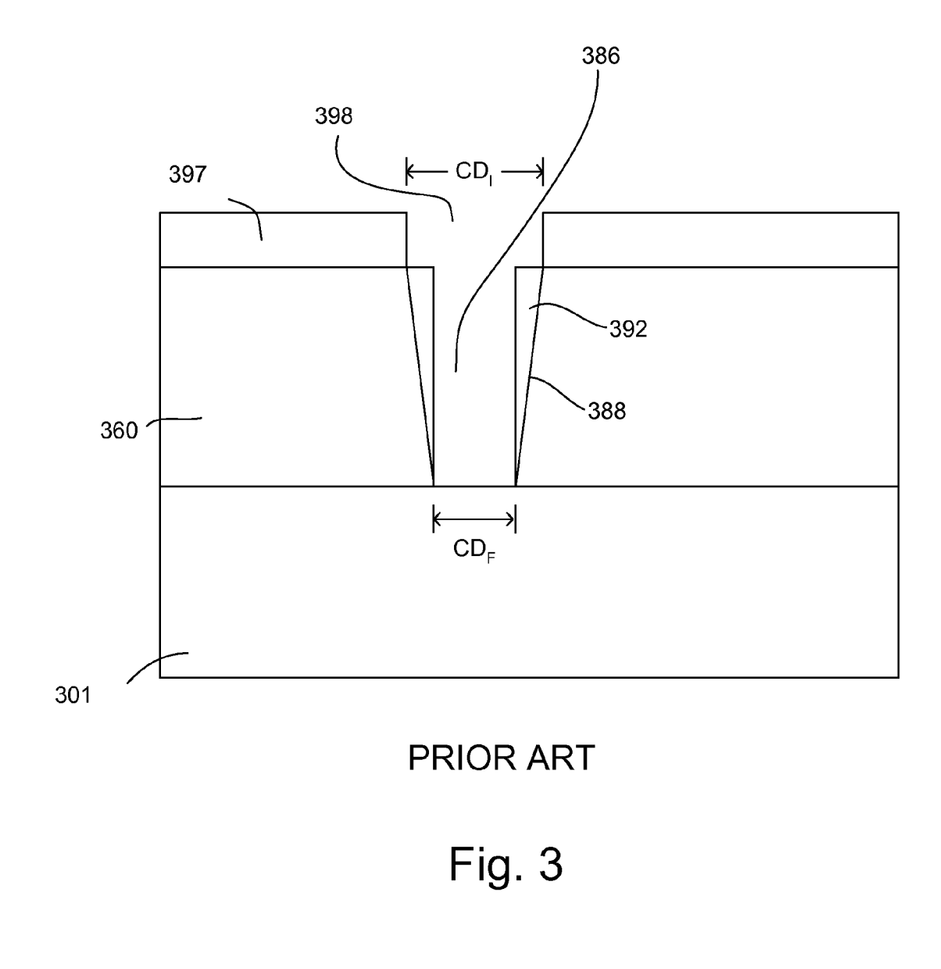
FIG. 3 shows a cross-sectional view of a contact opening formed using a polymerizing etch process.

A conventional technique for forming contact openings having $CD_D$ is to employ a polymerizing etch. For example, a photoresist 397 is patterned with an opening 398 having an initial CD ($CD_I$), as shown in FIG. 3. The initial CD, for example, corresponds to the CD created by the lithographic system ($CD_L$). The photoresist is used as an etch mask to etch the contact opening in a dielectric layer 360 on a substrate 301. By employing a polymerizing etch, polymer 392 deposits on sidewall 388 of the opening as the dielectric layer is etched. The polymer acts as an etch mask lining the sidewall. As the etch continues, more and more polymer is deposited, reducing the size of the opening. The polymerizing etch results in an opening with a tapered sidewall. The bottom of the opening has a final CD ($CD_F$) which is smaller than $CD_I$ or $CD_L$.

However, such a process is difficult to control and has a narrow process margin. Insufficient polymer deposition results in an opening having a $CD_F$ which is larger than $CD_D$, which can lead to shorting or leakage problems. On the other hand, too much polymer being deposited results in an opening having a $CD_F$ which is smaller than $CD_D$. This may lead to incomplete filling causing high resistance or opens in the contact. In either case, reliability or functionality of the IC is negatively impacted.

From the foregoing discussion, it is desirable to provide improved CD control of contact openings or other features.

SUMMARY OF THE INVENTION

A method of forming a feature is presented. The method includes providing a substrate with a first layer with a patterned second layer over the first layer. The patterned second layer includes a second layer opening having a first critical dimension (CD) which is equal to the CD produced by a lithographic system ($CD_L$). $CD_L$ is larger than a desired CD ($CD_D$). A third layer is formed over the substrate. The third layer fills the opening and leaves a top surface of the second layer exposed. The second layer is removed to produce a mesa formed by the third layer. The CD of the mesa is equal to about the first CD. The mesa is trimmed to produce a mesa with a second CD. The second CD is equal to about $CD_D$. A fourth layer is formed on the substrate to cover the first layer, leaving a top of the mesa exposed. The substrate is etched to remove the mesa and a portion of the first layer below the mesa to form an opening in the first layer with $CD_D$.

In another embodiment, a device is disclosed. The device includes a substrate and a first layer on the substrate. An opening is in the first layer. The opening has a dimension equal to a desired CD ($CD_D$) which is smaller than a CD produced by a lithographic system ($CD_L$) used in forming the device, and a sidewall of the opening is substantially devoid of polymer deposits and is substantially vertical.

In yet another embodiment, a method of forming a device is presented. The method includes providing a substrate and forming a first layer on the substrate. An opening is formed in the first layer. The opening has a dimension equal to a desired CD ($CD_D$) which is smaller than a CD produced by a lithographic system ($CD_L$) used in forming the device, and a sidewall of the opening is substantially devoid of polymer deposits and is substantially vertical.

These and other objects, along with advantages and features of the present invention herein disclosed, will become apparent through reference to the following description and the accompany drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION OF THE INVENTION

Embodiments generally relate to devices, for example, semiconductor devices or integrated circuits (ICs). More particularly, the embodiments relate to features which have a desired CD ($CD_D$) according to design requirements of the device. The desired or design CD is smaller than the CD provided by the lithographic system ($CD_L$). In one embodiment, a feature, for example, is an opening. In one embodiment, the feature is a contact or via opening in which a contact is formed. Other types of features having $CD_D$ may also be useful. The ICs can be any type of IC, such as dynamic or static random access memories, signal processors, microcontrollers or system-on-chip (SoC) devices. The devices or ICs can be incorporated into or used with, for example, consumer electronic products, such as computers, cell phones, and personal digital assistants (PDAs).

Figure 1:
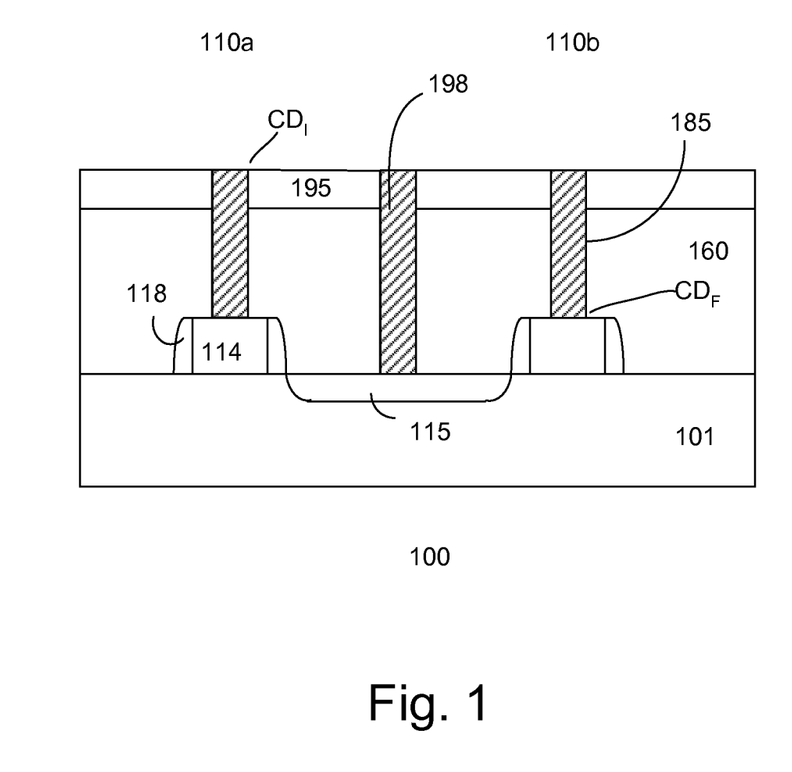
FIG. 1 shows a cross-sectional view of an embodiment of a portion of a device.

FIG. 1 shows a cross-sectional view of a portion of an embodiment of a device 100. The device, for example, is an IC. Other types of devices may also be useful. As shown, the portion includes a substrate 101. In one embodiment, the substrate is a semiconductor substrate. For example, the substrate may be a silicon substrate. In some embodiments, the substrate may be a lightly doped substrate, such as a lightly doped p-type substrate. Other types of substrates may also be useful. Such substrates may include silicon germanium, gallium arsenide, germanium or semiconductor-on-insulator, such a silicon-on-insulator (SOI), substrates. The substrate may also be undoped or doped with other types of dopants or dopant concentrations. The substrate may include circuit components such as transistors, capacitors or resistors formed thereon with contact regions. Other types of circuit components are also useful. Generally, the substrate includes numerous circuit components and contact regions.

The substrate is prepared with one or more contact regions. The contact regions may be source/drain (S/D) regions and gates of transistors. Other types of contact regions, such as junction contact regions, may also be useful.

As shown, the substrate is prepared with transistors 110a-b. A transistor includes a gate 114 with S/D diffusion regions adjacent to first and second sides of the gate. Adjacent transistors may be configured to share an S/D common diffusion region 115. Other configurations of transistors may also be useful. For example, the transistors may have non-common S/D diffusion regions. The gate can be formed as gate conductors. A gate conductor may serve as a common gate for a plurality of transistors. In some cases, the gate conductor may serve as a wordline of a memory array. Forming individual gates is also useful. Other configurations of gates may also be useful. Dielectric spacers 118 may be provided on the gate sidewalls. The spacers may be used to facilitate forming lightly doped S/D (LDD) regions (not shown).

Isolation regions (not shown) can also be provided to isolate transistors for other transistors or circuit components. For example, an isolation device may surround a transistor region on which a transistor is formed. In other cases, multiple transistors, such as those which share a common S/D region, may be surrounded by an isolation region. Other configurations of isolation regions and transistors or circuit components may also be useful. Furthermore, it is understood that transistors are shown for illustrative purposes and that the substrate can also be prepared with other types or arrangements of circuit components.

A first layer is disposed on the substrate, covering the contact regions. For example, the first layer is disposed on the substrate, covering the transistors as well as other types of contact regions. The first layer 160, for example, is formed of a dielectric material. The first layer, for example, may serve as a pre-metal dielectric (PMD) layer. Other types of first layers may also be useful. For example, the first lay may be an inter-level dielectric (ILD) layer or an inter-metal dielectric (IMD) layer. The dielectric layer, for example, may be silicon oxide. Other types of dielectric materials including doped silicon oxide such as fluorinated silicon oxide (FSG), undoped or doped silicate glasses such as boron phosphate silicate glass (BPSG) and phosphate silicate glass (PSG), spin-on glass (SOG), undoped or doped thermally grown silicon oxide, undoped or doped TEOS deposited silicon oxide, and other low-k or ultra low-k dielectric materials can also be used to form the PMD layer. In one embodiment, the first layer is about 200 nm thick. Preferably, the thickness of the first layer is in the range of about 100-300 nm. Other thicknesses are also useful, for example, depending on the desired height of the contacts to interconnecting lines.

Features 185 are formed in the dielectric layer. In one embodiment, the features are contact openings in communication with the contact regions below the dielectric. For example, the contact openings are in communication with S/D regions and gates of the transistors. Conductive contacts 198 are disposed in the contact openings. The contacts, for example, may be formed of tungsten (W). Contacts formed of other conductive materials, such as copper, aluminum, or conductive alloys, may also be useful. The contacts, for example, provide electrical connections between the contact regions below and interconnects disposed over the first layer.

In one embodiment, a hard mask layer 195 is disposed on the first layer. The hard mask layer, for example, is formed of a material to which the first layer can be etched selectively. In one embodiment, the hard mask layer is formed of a dielectric material. For example, the hard mask layer may be formed of silicon nitride. Other types of hard mask materials may also be useful. As shown, the hard mask layer has a top surface which is coplanar with the top surface of the contacts. In other embodiments, the hard mask layer may be removed. Other configurations of contacts, contact regions and interconnects, may also be useful.

The CD of the contact openings is equal to about the $CD_D$. In one embodiment, $CD_I$ of the opening at the top is equal to about $CD_D$. In other words, $CD_I$ is smaller than $CD_L$. Since $CD_I$ is equal to about $CD_D$, a polymerizing etch to form the opening is not needed. By avoiding a polymerizing etch, the sidewalls of the contact openings are devoid or substantially devoid of polymer deposits and are vertical or substantially vertical (e.g., the vertical direction is perpendicular to the substrate surface). For example, the sidewalls of the contact openings may form an angle of about 0-0.5° with the vertical direction. In one embodiment, $CD_I$ is equal to or substantially equal to about $CD_F$ at the bottom of the opening and both are equal to about $CD_D$.

As shown, the hard mask remains on the surface of the dielectric layer. For example, the top of the hard mask and top of the contacts are coplanar. In other embodiments, the hard mask may be removed. For example, the hard mask may be removed by a polishing process, such as chemical mechanical polishing (CMP). The polishing process forms a coplanar surface with the top of the contacts and top of the dielectric layer.

Figure 2A:
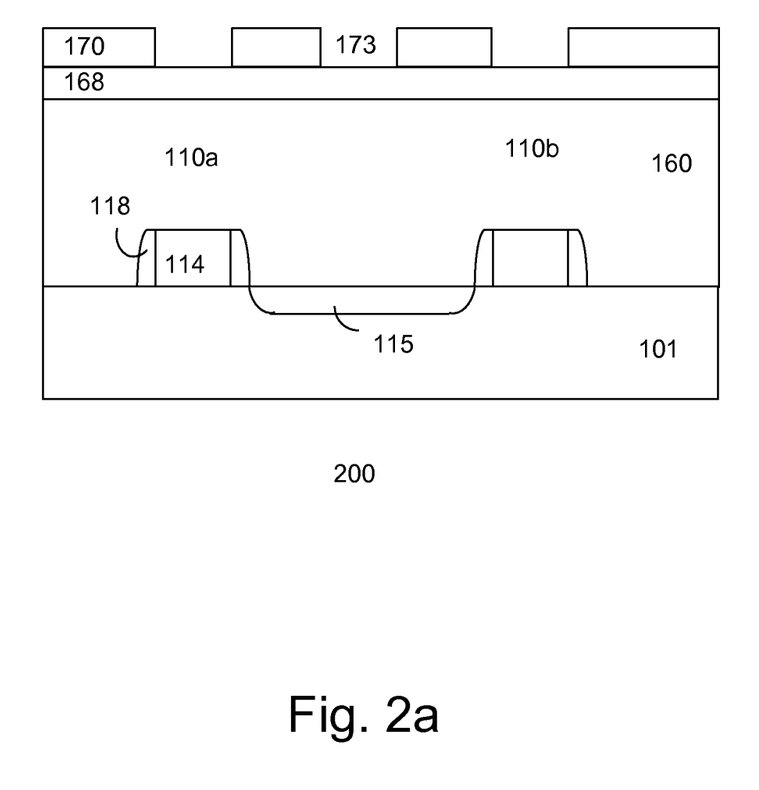
FIGS. 2a-2j show a process for forming an embodiment of a portion of a device.

FIGS. 2a-j show cross-sectional views of an embodiment of a process 200 for forming a device. The device, for example, is an IC. Other types of devices may also be useful. Referring to FIG. 2a, a portion of the device is shown. The device is formed on a substrate 101. The substrate 101 may be, for example, a semiconductor substrate. The semiconductor substrate may be a lightly doped p-type silicon substrate. Other types of substrates, such as a germanium-based, gallium arsenide, silicon-on-insulator (SOI), or sapphire substrate, are also useful.

The substrate, as shown, is prepared with transistors 110a-b. A transistor includes a gate 114 disposed on the substrate. A gate, for example, includes an electrode over a gate dielectric layer (not shown). Dielectric spacers 118 may be provided on first and second gate sidewalls. The substrate may include S/D diffusion regions adjacent to the first and second gate sidewalls. The gate and S/D diffusion regions may serve as electrodes for a transistor. The transistors, for example, may share a common S/D region 115. Other configurations of transistors may also be useful. Isolation regions (not shown) can also be provided to isolate transistors for other circuit components. Other configurations of isolation regions and transistors may also be useful.

In one embodiment, a first layer 160 is formed on the substrate. In one embodiment, the first layer includes a first material. In one embodiment, the first layer is a dielectric layer. For example, the first material is a dielectric material. Other types of layers may also be useful. The dielectric layer, for example, serves as a PMD layer. In one embodiment, the PMD layer is formed of silicon dioxide. Other types of dielectric materials including doped silicon oxide such as fluorinated silicon oxide (FSG), undoped or doped silicate glasses such as boron phosphate silicate glass (BPSG) and phosphate silicate glass (PSG), spin-on glass (SOG), undoped or doped thermally grown silicon oxide, undoped or doped TEOS deposited silicon oxide, and other low-k or ultra low-k dielectric materials can also be used to form the PMD layer. In one embodiment, the first layer is about 200 nm thick. Preferably, the thickness of the first layer is in the range of about 100-300 nm. Other thicknesses are also useful.

The first layer can be deposited using various types of processes. For example, the first layer is deposited using chemical vapor deposition (CVD), including plasma enhanced (PECVD), high density (HDCVD), atmospheric pressure (APCVD). Other techniques, such as spin-on processes, depending on the type of material used and application, may also be useful. In one embodiment, the first layer is silicon oxide formed by PECVD using tetraethylorthosilicate (TEOS) as the main precursor gas. A planarization process, such as a chemical mechanical polish (CMP), can be performed, if necessary, to provide a planar top surface.

In one embodiment, a second layer 168 is disposed over the PMD layer. In one embodiment, the second layer serves as a hard mask layer. The second layer is formed of a second material which the first material can be etched with selectively to it. The second layer may be, for example, silicon nitride (SiN). Other types of materials which the first layer can be etched with selectively to it may also be useful. For example, the first layer may be an advanced patterning film (APF) or a conductive layer. The second layer should be sufficiently thick to process the first layer. In one embodiment, the second layer is about 50 nm thick. Other thicknesses are also useful. In one embodiment, the second layer is formed by CVD. Other forming or deposition techniques may also be useful.

A soft mask layer 170 is formed over the second layer. In one embodiment, the soft mask layer is formed of photoresist. An antireflective coating (not shown) may be formed above the second layer 168 to reduce substrate reflectivity. The antireflective coating (ARC) can be of an organic or inorganic material and formed by appropriate techniques, such as spin-on, sputtering or CVD. Other techniques may also be useful. In one embodiment, the ARC is of an organic material formed by a spin-on process. Alternatively, the ARC can be an inorganic material formed by, for example, CVD or physical vapor deposition (PVD).

In one embodiment, the soft mask layer 170 is patterned to form openings 173. The openings, for example, correspond to the contact regions below the first layer. The dimension of the openings is equal to a first dimension. The first dimension, in one embodiment, is equal to $CD_L$. As discussed, $CD_L$ is larger than $CD_D$. Conventional lithographic and patterning processes can be employed to pattern the soft mask. For example, the photoresist is exposed to an exposure source with the desired pattern and developed to remove desired portions to form the openings.

Figure 2B:
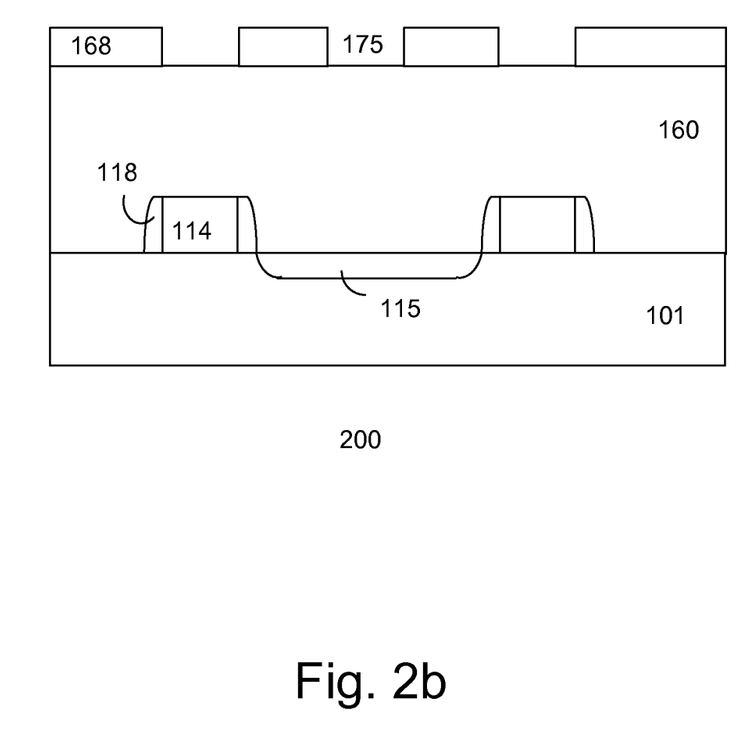

In FIG. 2b, the second layer 168 is patterned using the soft mask as the etch mask. The ARC layer may also be patterned. Openings 175 are formed in the second layer by removing the exposed portions not covered by the soft mask. The second layer can be patterned using an anisotropic etch, such as reactive ion etch (RIE) or dry etch. In one embodiment, the second layer, which is formed of SiN, is etched using a high silicon nitride etch rate recipe, such as $SF_6$/HBr/He or $CF_4$/Ar chemistry. These etch recipes include high fluorine atom plasma which maintains a near vertical silicon nitride profile and excellent critical dimension control. For example, using CF4/Ar chemistry, the gases are flowed at the rate of about 50 sccm for CF4 and 500 sccm for Ar. The soft mask is removed after patterning. Other chemistries for patterning the second layer may also be useful. The CD of the openings in the second layer is equal to about $CD_L$.

Figure 2C:
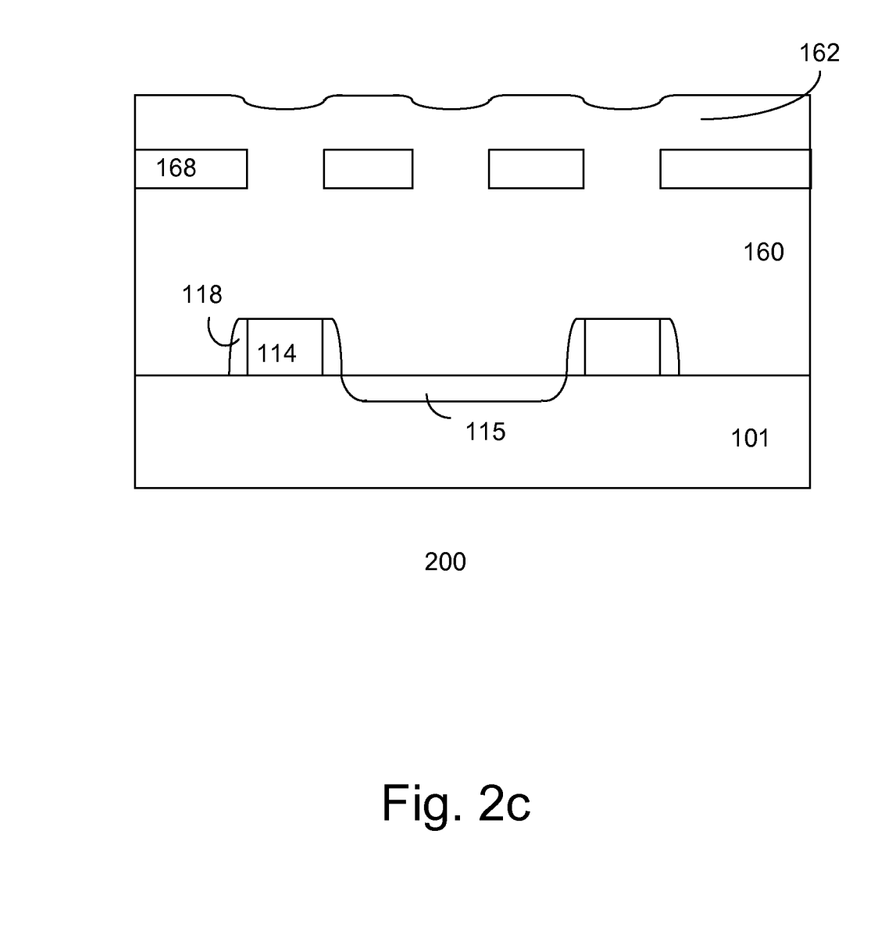

Referring to FIG. 2c, a third layer 162 is deposited on the substrate, covering the first layer 160 and the second layer 168. In one embodiment, the third layer 162 is deposited conformally over the substrate. Non-conformal deposition may also be useful. In one embodiment, the third layer includes a third material. The third layer, in one embodiment, is formed of a dielectric material. For example, the third layer is formed of silicon oxide. Other types of dielectric materials, such as fluorinated silicon oxide (FSG), silicate glasses such as boron phosphate silicate glass (BPSG) and phosphate silicate glass (PSG), spin-on glass (SOG), undoped or doped thermally grown silicon oxide, undoped or doped TEOS deposited silicon oxide, and other low-k or ultra low-k dielectric materials, may also be useful. The third layer may include other types of material. For example, the third layer may be formed of any type of material which can be removed selectively to the second layer. In one embodiment, the third layer is formed by CVD or PVD. Other techniques may also be employed to form the third layer. In a preferred embodiment, the third and first materials are the same. For example, the third layer is formed of the same material as the first layer. Providing first and third layers which are different may also be useful.

Figure 2D:
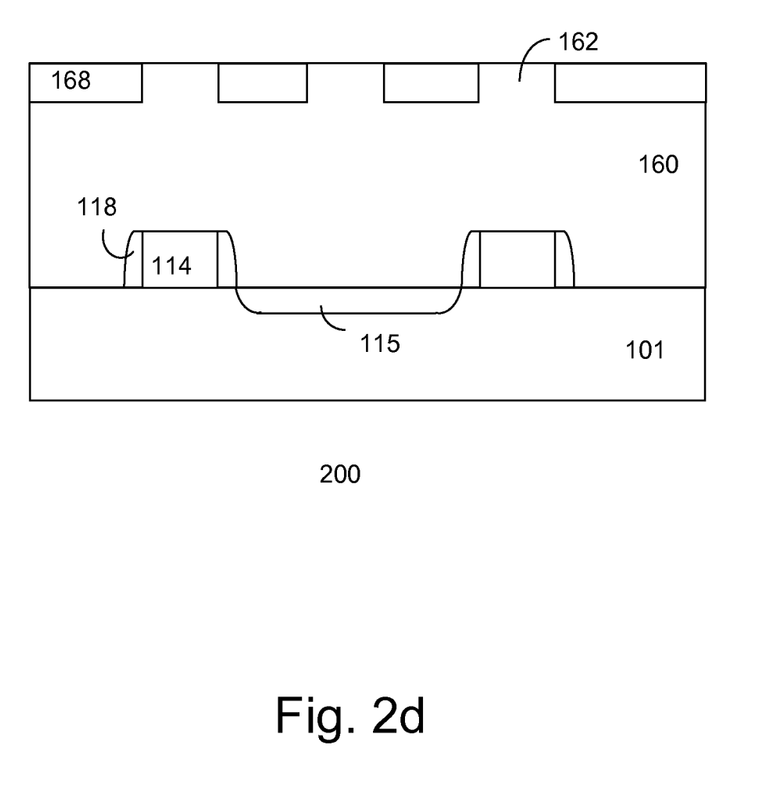

In FIG. 2d, a planarization process is performed on the substrate. The planarization process removes a portion of the third layer above the second layer. This, for example, produces a planar surface between the second and third layers 168 and 162. The planarization process, in one embodiment, includes CMP. Other types of planarization processes may also be useful.

Figure 2E:
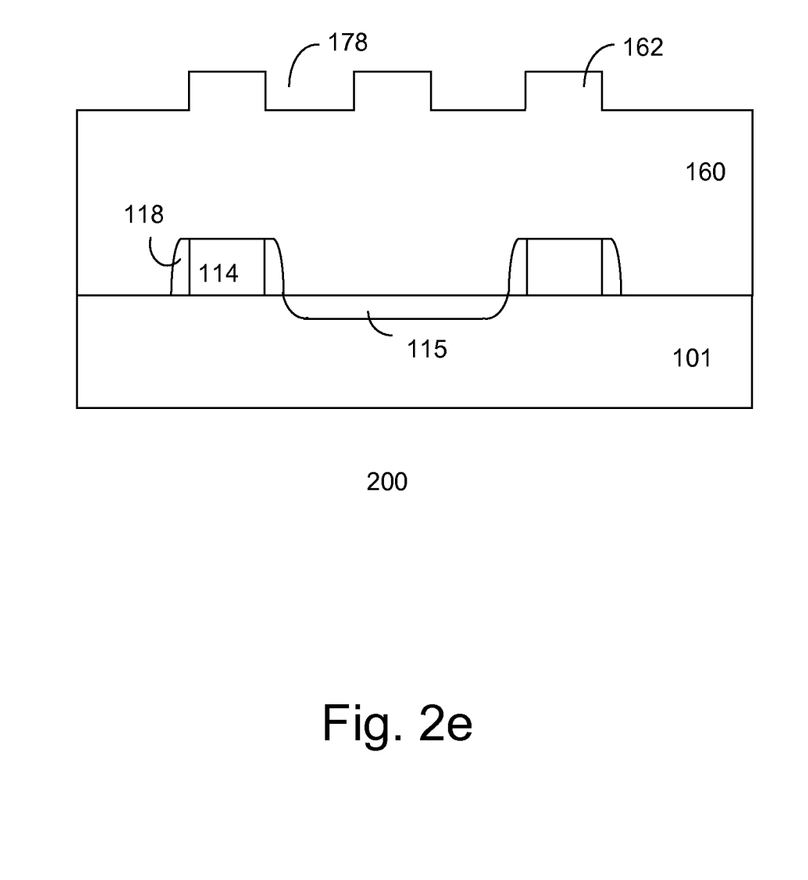

Referring to FIG. 2e, the second layer is removed. The removal of the second layer results in a topology on the substrate. For example, the topology includes mesas formed of the remaining portions of the third layer 162 which protrude above the surface of the first layer. The removal of the second layer, in one embodiment, is achieved by a wet etch employing, for example, a HF solution. Other techniques of removing the second layer may also be useful.

Figure 2F:
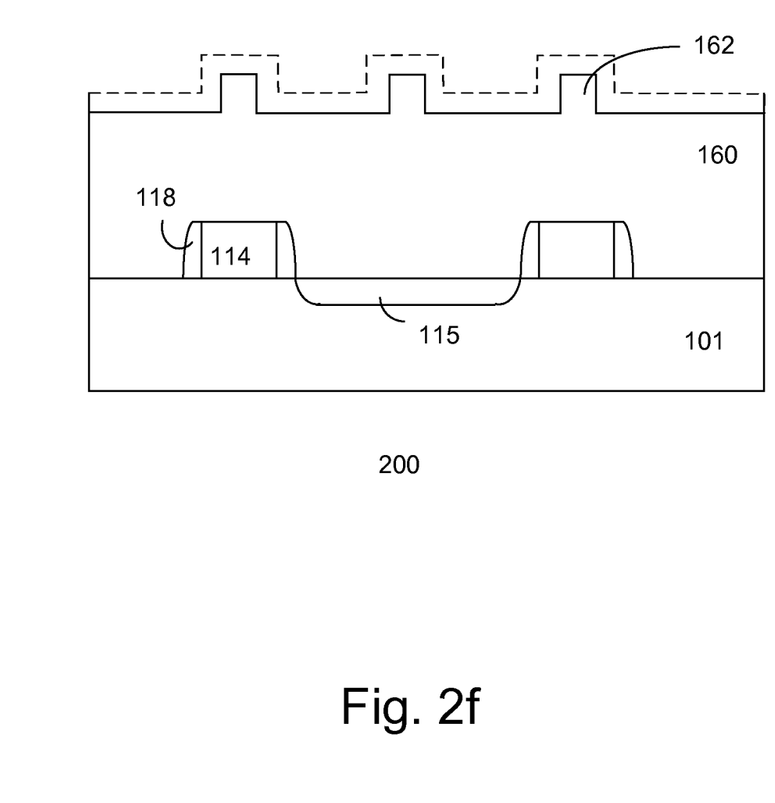

In FIG. 2f, a trimming process is performed to partially remove at least a portion of the third layer. The trimming process, in one embodiment, is an isotropic etch, such as a wet etch. Other types of trimming processes may also be useful. The trimming process at least partially reduces the width of the mesas formed by the third layer. If the third and first layers are of the same or similar materials, a height of the first layer may also be reduced. For example, the trimming process reduces the dimension of the mesas from the first dimension to a second dimension. In one embodiment, the second dimension of the mesas is equal to about $CD_D$ of openings formed in the first layer.

Figure 2G:
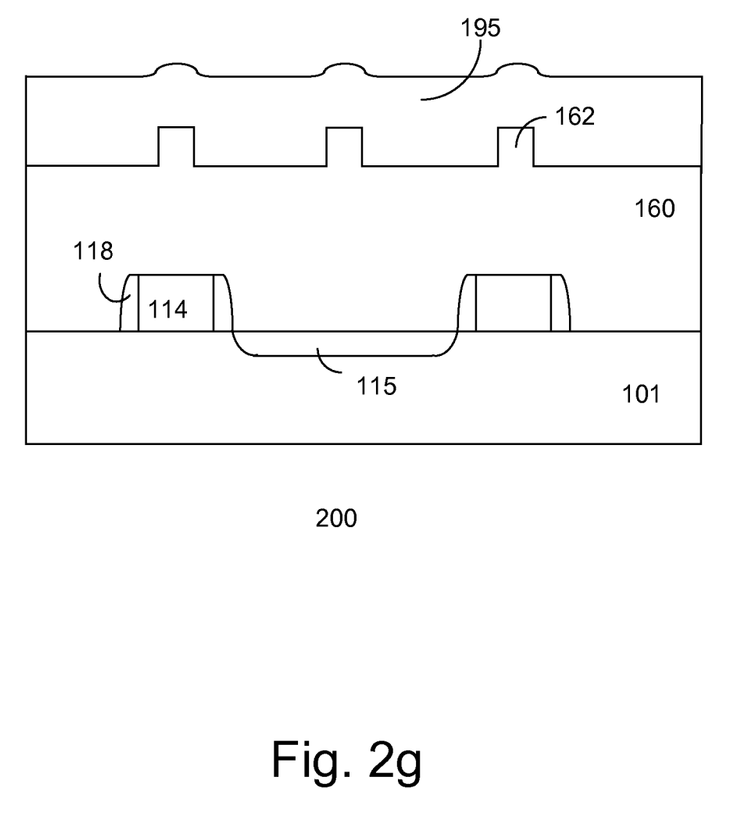

As illustrated by FIG. 2g, a fourth layer 195 is formed over the substrate. The fourth layer at least covers the mesas of the third layer. The fourth layer serves as an etch mask for subsequently forming openings in the first layer. The openings, for example, are contact openings which correspond to contact regions below the first layer. The CD of the contact openings is equal to about $CD_D$. In one embodiment, the fourth layer is formed of a dielectric layer which the first layer can be etched with selectively to it. For example, the fourth layer is formed of SiN. Other types of hard mask materials, such as conductive materials, may also be useful. In one embodiment, the fourth layer is preferably the same material as the removed second layer. Providing second and fourth layers formed of different materials may also be useful.

Figure 2H:
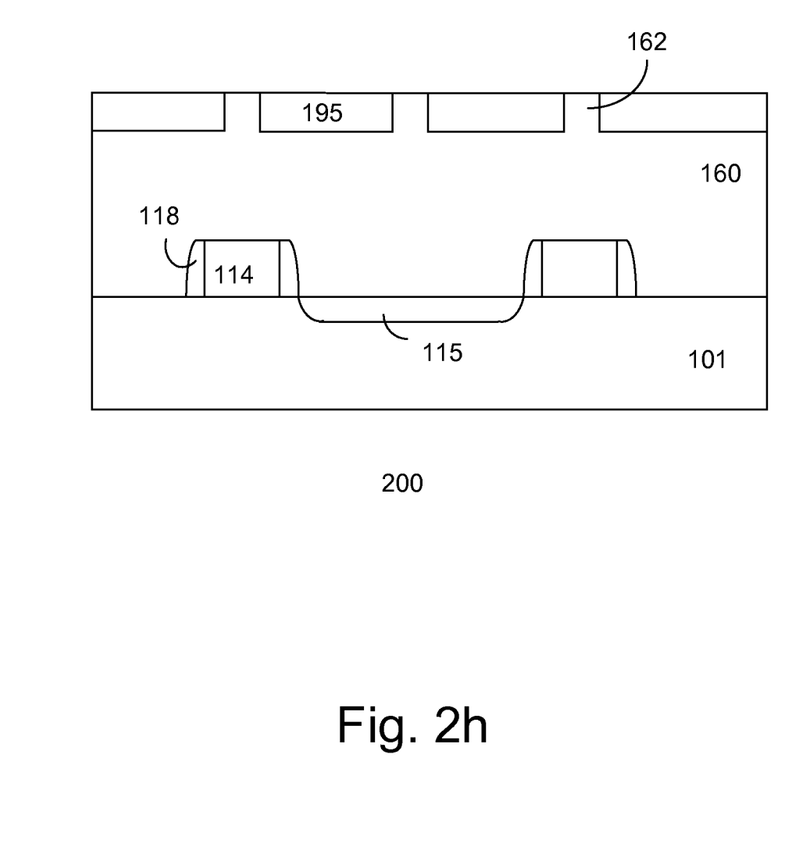

In FIG. 2h, a planarization process is performed to remove excess materials of the fourth layer such that it is coplanar with the top of the mesas. In one embodiment, the planarization process includes a CMP or an etch back. Other types of planarization processes may also be useful.

Figure 2I:
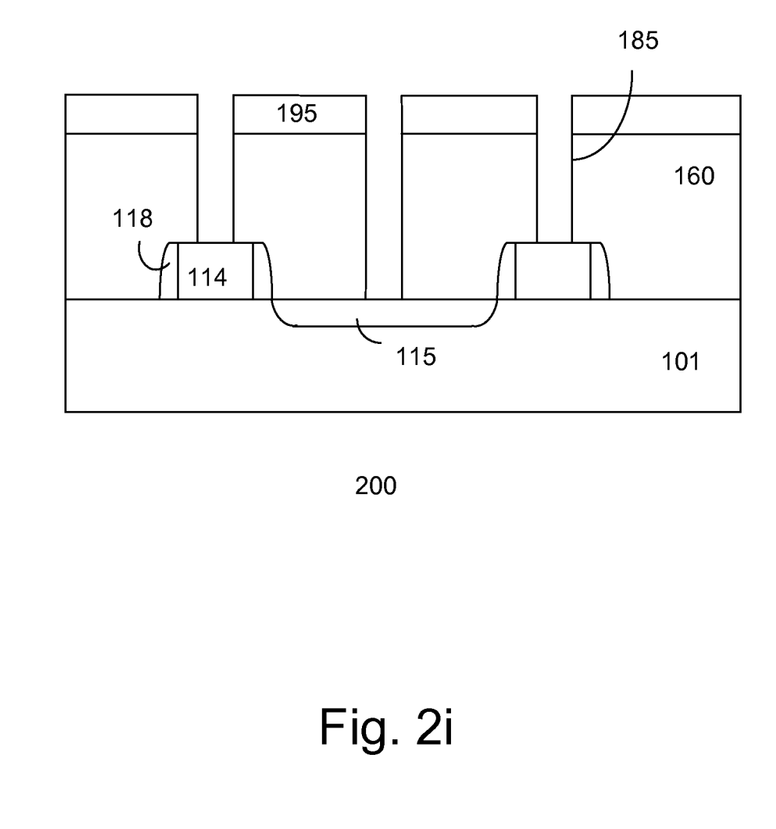

Referring to FIG. 2i, the mesas of the third layer and portions of the first layer under them are removed by an anisotropic etch to form openings in the first layer using the fourth layer as an etch mask. The openings, for example, correspond to contact regions below the first layer, such as gates and S/D regions. The CD of the openings in the first layer, in one embodiment, is equal to $CD_D$, which is less than $CD_L$.

In one embodiment, the first material of the first layer and the mesas of the third layer are removed by an anisotropic etch, such as an RIE. The RIE may remove both the mesas and portions of the first layer using the same chemistry. For example, a single anisotropic etching process can be performed to remove the mesas and portions of the first layer. This may be possible when the first and third layers are of the same or similar materials which can be etched non-selectively. In other embodiments, different chemistries may be used to separately remove the mesas and the portions of the first layer.

In one embodiment, the first layer is etched using a clean chemistry. The use of a clean chemistry advantageously avoids or reduces polymer buildup in the openings during etching. This facilitates forming openings with vertical or substantially vertical sidewalls. In one embodiment, the first layer is patterned using a fluorocarbon chemistry (e.g., $C_4F_6$). The process, for example, is performed at a pressure of about 30 to 200 mT and a temperature of less than about 200° C. Other etch chemistries or parameters to reduce polymer buildup are also useful.

Figure 2J:
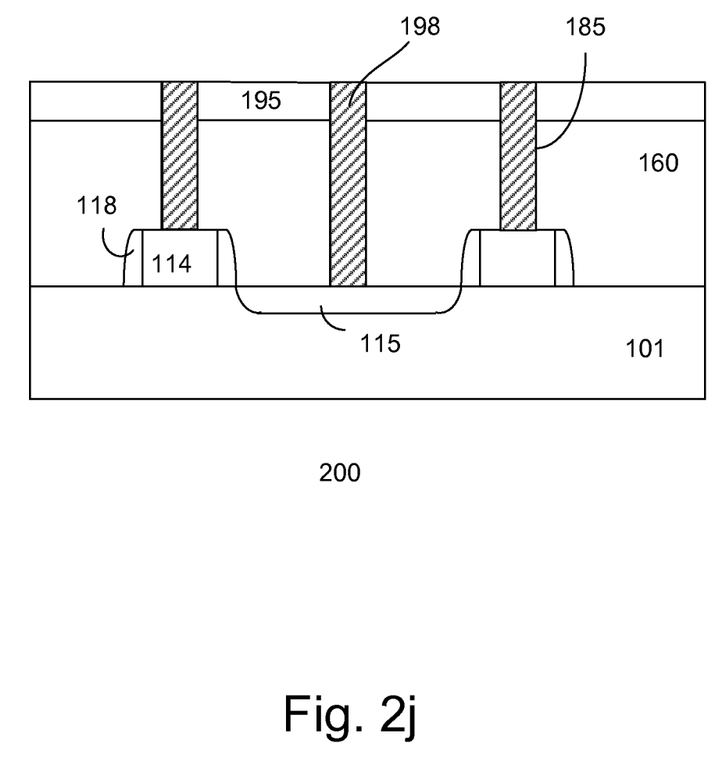

Referring to FIG. 2j, a conductive layer is deposited on the substrate, filling the openings and covering the substrate. For example, the conductive layer fills the openings and covers the fourth layer. In one embodiment, the conductive materials include tungsten (W). Other types of conductive materials, such as copper and aluminum, are also useful. The conductive material, for example, may be formed by sputtering. Other techniques may also be useful to form the conductive layer. Excess conductive materials over the substrate are removed to form contacts 198 in the openings. In one embodiment, CMP is used to remove the excess conductive materials, using the fourth layer as a CMP stop. This produces a planar top surface. For example, the top of the contacts and fourth layer is coplanar. The contacts, for example, connect the contact regions, such as gates and S/D regions of transistors to conductive interconnects (not shown) of an interconnect or metal level.

As described, the hard mask remains over the dielectric layer, forming coplanar top surface with the top of the contacts. In some, embodiments, the hard mask is removed. In one embodiment, the hard mask may be removed by the CMP process to form the contacts. For example, excess conductive material along with the hard mask is removed by CMP. This leaves a coplanar surface between the top of the dielectric layer and contacts.

In other embodiments, the hard mask is removed after forming the openings, as shown in FIG. 2i. The hard mask may be removed, for example, by a wet etch. After removal, the contact openings are filled with conductive material. The process continues as described in FIG. 2j.

The process continues to complete fabricating the IC. For example, the process continues to form interconnects, additional interconnect levels, passivation layer, dicing, assembly and packaging. In alternative embodiments, interconnects and contacts can be formed using dual damascene techniques. With the use of a composite etch stop layer according to the invention, polymerization in the contact opening can be avoided. Additionally, the contacts can be formed with minimal erosion of silicide contact and isolation material, increasing process window and yields.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a substrate;
   a transistor having a gate disposed on the substrate, wherein the transistor comprises first and second source/drain (S/D) regions disposed in the substrate and adjacent to first and second sides of the gate;
   a first dielectric layer disposed on the substrate, wherein the first dielectric layer covers the transistor gate and includes a completely planar top surface extending over the transistor;
   a second dielectric layer disposed above the first dielectric layer, wherein the second dielectric layer includes completely planar top and bottom surfaces which extend along a parallel direction to the planar top surface of the first dielectric layer; and
   at least one via contact opening extending through the first and second dielectric layers, wherein
      the via contact opening is in direct communication with the first or second S/D region,
      the via contact opening comprises vertical sidewalls defined by the first and the second dielectric layers, wherein the vertical sidewalls of the via contact opening define a desired critical dimension ($CD_D$) of the via contact opening extending uniformly throughout the first and second dielectric layers, wherein the desired critical dimension ($CD_D$) is smaller than a critical dimension (CD) produced by a lithographic system ($CD_L$) used in forming the device, and
      a conductive contact is disposed in and fills the via contact opening, wherein the conductive contact is directly coupled to the first or second S/D region, and the conductive contact directly contacts the vertical sidewalls of the via contact opening.

2. The device of claim 1 wherein the vertical sidewalls of the via contact opening defined by the first dielectric layer are aligned to the vertical sidewalls of the via contact opening defined by the second dielectric layer.

3. The device of claim 1 wherein the first dielectric layer comprises a first material which can be etched with selectivity to the second dielectric layer.

4. The device of claim 2 wherein the first dielectric layer comprises silicon oxide and the second dielectric layer comprises silicon nitride.

5. The device of claim 1 wherein the substrate further comprises one or more circuit components with contact regions formed thereon.

6. The device of claim 5 wherein the first dielectric layer extends to cover the one or more circuit components.

7. The device of claim 1 wherein the vertical sidewalls of the via contact opening is perpendicular to a surface of the substrate.

8. The device of claim 1 comprising an initial CD ($CD_I$) at a top of the via contact opening and a final CD ($CD_F$) at a bottom of the via contact opening, wherein $CD_I$ is defined by a portion of the via contact opening in the second layer and $CD_F$ is defined by a portion of the via contact opening contiguous to the first or the second S/D region.

9. The device of claim 8 wherein the $CD_I$ is equal to the $CD_F$ which is equal to the $CD_D$.

10. The device of claim 1 wherein the first dielectric layer is a pre-metal dielectric layer which directly contacts the substrate and extends continuously over the transistor gate and the first and second S/D regions.

11. A semiconductor device comprising:
a substrate having one or more circuit components with contact regions formed thereon, wherein the one or more circuit components include a transistor having a gate disposed on the substrate, wherein the transistor comprises first and second source/drain (S/D) regions disposed in the substrate and adjacent to first and second sides of the gate;
a first dielectric layer on the substrate, wherein the first dielectric layer includes a completely planar top surface extending over the transistor gate and the first and second S/D regions; and
at least one via contact opening extending throughout the first dielectric layer, wherein
the via contact opening includes vertical sidewalls defined by the first dielectric layer, wherein the vertical sidewalls of the via contact opening define a desired critical dimension ($CD_D$) of the via contact opening which is smaller than a critical dimension (CD) produced by a lithographic system ($CD_L$) used in forming the device, wherein the $CD_D$ of the via contact opening extends uniformly throughout the first dielectric layer, and
a conductive contact is disposed in and fills the via contact opening, wherein the conductive contact is directly coupled to the first or second S/D region.

12. The device of claim 11 wherein the conductive contact comprises a dimension corresponding to the $CD_D$ of the via contact opening.

13. The device of claim 11 wherein the via contact opening comprises an initial CD ($CD_I$) at a top end portion of the via contact opening and a final CD ($CD_F$) at a bottom end portion of the via contact opening.

14. The device of claim 13 wherein the $CD_I$ is equal to the $CD_F$ which is equal to the $CD_D$.

15. The device of claim 11 wherein the transistor is a first transistor and the one or more circuit components further comprise a second transistor having a gate disposed on the substrate, wherein the planar top surface of the first dielectric layer extends continuously over the gates of the first and second transistors.

16. The device in claim 11 wherein the vertical sidewalls of the via contact opening correspond to sidewalls of the first dielectric layer, and the conductive contact directly contacts the vertical sidewalls of the via contact opening.

17. The device of claim 11 wherein a width of a top surface of the conductive contact is equal to a width of a bottom surface of the conductive contact.

18. A semiconductor device comprising:
a substrate having one or more circuit components with contact regions formed thereon;
a first layer on the substrate, wherein the first layer comprises dielectric material and a completely planar top surface extending over the one or more circuit components; and
at least one via contact opening extending through the first layer, wherein
the via contact opening includes vertical sidewalls defined by the first layer, wherein the vertical sidewalls of the via contact opening define a desired critical dimension ($CD_D$) of the via contact opening which is smaller than a critical dimension (CD) produced by a lithographic system ($CD_L$) used in forming the device, wherein the $CD_D$ of the via contact opening extends uniformly throughout, and
a conductive contact is disposed in and fills the via contact opening, wherein the conductive contact is in direct contact with the vertical sidewalls of the via contact opening, wherein the conductive contact is directly coupled to the contact region of the one or more circuit components.

19. The device of claim 18 wherein the $CD_D$ is smaller than a critical dimension (CD) produced by an etch mask which is patterned by the lithographic system.

20. The device of claim 19 wherein the via contact opening comprises an initial CD ($CD_I$) at a top of the via contact opening and a final CD ($CD_F$) at a bottom of the via contact opening, wherein the $CD_I$ is equal to $CD_F$ which is equal to the $CD_D$.

* * * * *